United States Patent [19]
Ichikawa et al.

[11] Patent Number: 5,970,322
[45] Date of Patent: Oct. 19, 1999

[54] ULTRAHIGH-FREQUENCY ELECTRONIC COMPONENT AND METHOD OF MANUFACTURING THE SAME

[75] Inventors: Seiji Ichikawa; Tomoaki Hirokawa; Tomoaki Kimura; Taku Sato; Junichi Tanaka; Kenji Uchida; Masatoshi Ohara; Takeo Ogihara; Satoshi Murata; Tsutomu Kubota, all of Tokyo, Japan

[73] Assignee: NEC Corporation, Tokyo, Japan

[21] Appl. No.: 09/004,447

[22] Filed: Jan. 8, 1998

Related U.S. Application Data

[62] Division of application No. 08/855,537, May 13, 1997, Pat. No. 5,889,232.

[30] Foreign Application Priority Data

May 14, 1996 [JP] Japan .................................. 8-118831

[51] Int. Cl.$^6$ ........................... H01L 21/44; H01L 21/48; H01L 21/50
[52] U.S. Cl. ........................... 438/124; 438/106; 438/121; 438/123
[58] Field of Search .................................. 438/124, 123, 438/121, 106

[56] References Cited

U.S. PATENT DOCUMENTS

| | | |
|---|---|---|
| 4,890,155 | 12/1989 | Miyagawa et al. . |
| 4,894,704 | 1/1990 | Endo . |
| 5,304,512 | 4/1994 | Arai et al. . |

FOREIGN PATENT DOCUMENTS

| | | |
|---|---|---|
| 61-166138 | 7/1986 | Japan . |
| 61-237455 | 10/1986 | Japan . |
| 63-79353 | 4/1988 | Japan . |
| 5251591 | 9/1993 | Japan . |

*Primary Examiner*—Kevin M. Picardat
*Assistant Examiner*—D. M. Collins
*Attorney, Agent, or Firm*—Sughrue, Mion, Zinn, Macpeak & Seas, PLLC

[57] ABSTRACT

An ultrahigh-frequency electronic component has an ultrahigh-frequency chip encased in a molded-resin package. The ultrahigh-frequency electronic component includes a first sealing layer encasing the ultrahigh-frequency chip therein and a second sealing layer encasing the first sealing layer therein. The first sealing layer contains a number of voids or minute air bubbles therein which are effective in reducing the permittivity of the first sealing layer. A method of manufacturing the ultrahigh-frequency electronic component is also disclosed.

3 Claims, 3 Drawing Sheets

ULTRAHIGH-FREQUENCY ELECTRONIC COMPONENT AND METHOD OF MANUFACTURING THE SAME

This is a divisional of Application Ser. No. 08/855,537 filed May 13, 1997 U.S. Pat. No. 5,889,232.

BACKGROUND OF THE INVENTION

1. Field of the Invention:

The present invention relates to an ultrahigh-frequency electronic component comprising an ultrahigh-frequency chip encased in a molded resin and a method of manufacturing such an ultrahigh-frequency electronic component.

2. Description of the Prior Art:

Ultrahigh-frequency electronic devices include transistors, ICs, optical devices, surface-acoustic-wave devices, and resonators. Since these devices are used in commercial communication apparatus and satellite-mounted apparatus, they are required to be highly reliable and to have a long service life. Therefore, these ultrahigh-frequency electronic devices are assembled in hollow packages of ceramics.

In recent years, many ultrahigh-frequency electronic devices are finding use in home electronic appliances such as satellite broadcast receivers, portable telephone sets, etc. Since devices for use in home electronic appliances do not need to be so reliable and durable as those in commercial communication apparatus and satellite-mounted apparatus, it is desirable that they can be manufactured less expensively. One approach to reduce the cost of ultrahigh-frequency electronic devices for home use is to encase them in a molded resin packages according to a transfer molding method.

The molded-resin packages have the same structure as those of semiconductor devices. Specifically, an ultrahigh-frequency chip is mounted on a lead frame and then electrically connected thereto by wire bonding, and the entire assembly is placed in a mold die set where it is encased in a molded epoxy resin.

When the ultrahigh-frequency chip and the lead frame are encased in their entirety in the molded epoxy resin, since the epoxy resin has a relatively large permittivity, large parasitic capacitances are developed between conductors on the chip or bonding wires, preventing the ultrahigh-frequency chip from having a desired high-frequency gain.

In order to alleviate the above drawback, it has been customary to use a resin having a relatively small permittivity to encase ultrahigh-frequency chips, to reduce the permittivity of a portion of the resin mass which covers the ultrahigh-frequency chip, or to provide a hollow in the molded-resin package for exposing the ultrahigh-frequency chip.

One molded-resin package which uses a resin having a relatively small permittivity is disclosed in Japanese Patent Laid-open Publication No. 86-237455, for example.

The disclosed molded-resin package comprises an ultrahigh-frequency semiconductor chip covered with a fluoroplastic sealing resin having a low permittivity, and the molded sealing resin is further encased in an epoxy resin. However, the disclosed molded-resin package is expensive to manufacture because the fluoroplastic resin is used as the sealing resin having a low permittivity. Another problem of the disclosed molded-resin package is that the fabrication process control is complex because it uses two types of resin.

Japanese Patent Laid-open Publication No. 88-79353, for example, shows a molded-resin package in which the permittivity of a portion of the resin mass which covers an ultrahigh-frequency semiconductor chip is relatively small. The disclosed molded-resin package is fabricated by supplying an ultrahigh-frequency semiconductor chip with a first sealing resin which comprises an epoxy resin mixed with minute hollow bodies to seal the surface of the ultrahigh-frequency semiconductor chip according to a potting method, and then encasing the first sealing resin with a second sealing resin according to a transfer molding method. The minute hollow bodies are in the form of hollow glass balls.

However, because the minute hollow bodies are mixed with the first sealing resin in order to reduce the permittivity thereof, the cost of the molded-resin package increases by the cost of the minute hollow bodies. The process of sealing the surface of the. ultrahigh-frequency semiconductor chip with the minute hollow bodies comprises a relatively large number of steps as it is necessary to disperse the minute hollow bodies uniformly in the first sealing resin.

A hollow molded-resin package is revealed in Japanese Patent Laid-open Publication No. 86-166138, for example. According to the disclosed fabrication process, a foaming agent is introduced into a sealing resin to cover an ultrahigh-frequency semiconductor chip, and after the sealing resin is poured into a mold die set, the foaming agent is foamed to produce a hollow where the ultrahigh-frequency semiconductor chip is exposed.

The cost of the hollow molded-resin package thus manufactured increases by the cost of the foaming agent. In addition, since the size and shape of the hollow cannot be controlled, ultrahigh-frequency semiconductor devices in such hollow molded-resin packages tend to suffer electric characteristic variations. If the hollow is excessively large, then the wall thickness of the molded sealing resin is excessively small, resulting in a reduction in the rigidity of the hollow molded-resin package.

SUMMARY OF THE INVENTION

It is an object of the present invention to provide an ultrahigh-frequency electronic component comprising an ultrahigh-frequency chip encased in a molded-resin package, which component can be manufactured relatively inexpensively by a relatively simple fabrication process without a reduction in the rigidity of the molded-resin package, and has excellent high-frequency characteristics.

In order to attain the objects described above, there is provided an ultrahigh-frequency electronic component comprising an ultrahigh-frequency chip encased in a first sealing resin layer and a second sealing resin layer encasing the first sealing resin layer therein, the first sealing resin layer containing a plurality of voids (minute air bubbles).

According to another aspect of the present invention, there is also provided a method of manufacturing an ultrahigh-frequency electronic component having an ultrahigh-frequency chip mounted on a lead frame and electrically connected thereto by wire bonding, the ultrahigh-frequency chip being encased by sealing resin, comprising the steps of placing the ultrahigh-frequency chip and the lead frame in a first mold cavity of a primary mold die set, introducing a first sealing resin into the first mold cavity under a first condition to produce voids in the first sealing resin, removing the ultrahigh-frequency chip and the lead frame encased in the solidified first sealing resin from the primary mold die set, placing the ultrahigh-frequency chip and the lead frame encased in the solidified first sealing resin in a second mold cavity of a secondary mold die set, introducing a second sealing resin into the second mold cavity under a second condition to produce no voids in the second sealing resin in order to encase the first sealing resin encasing the ultrahigh-frequency chip and the lead frame, and removing the resin encased chip and lead frame from the second die set as the ultrahigh-frequency electronic component. The first and second sealing resins may be the same types of resin.

The above and other objects, features, and advantages of the present invention will become apparent from the following description with references to the accompanying drawings which illustrate examples of the present invention.

BRIEF DESCRIPTION OF THE DRAWINGS

FIGS. 1(a) through 1(e) are fragmentary cross-sectional views illustrative of a process according to a third embodiment of the present invention of manufacturing an ultrahigh-frequency electronic component.

DETAILED DESCRIPTION OF THE PREFERRED EMBODIMENTS

A process according to a third embodiment of the present invention of manufacturing an ultrahigh-frequency electronic component will be described below with reference to FIGS. 1(a) through 1(e).

Figure 1A:
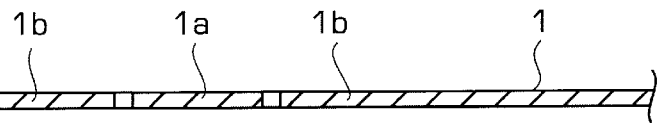
Figure 1B:
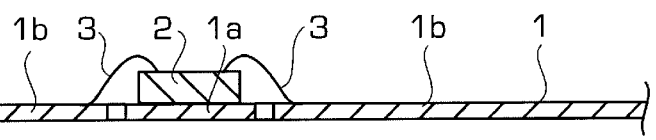
Figure 1C:
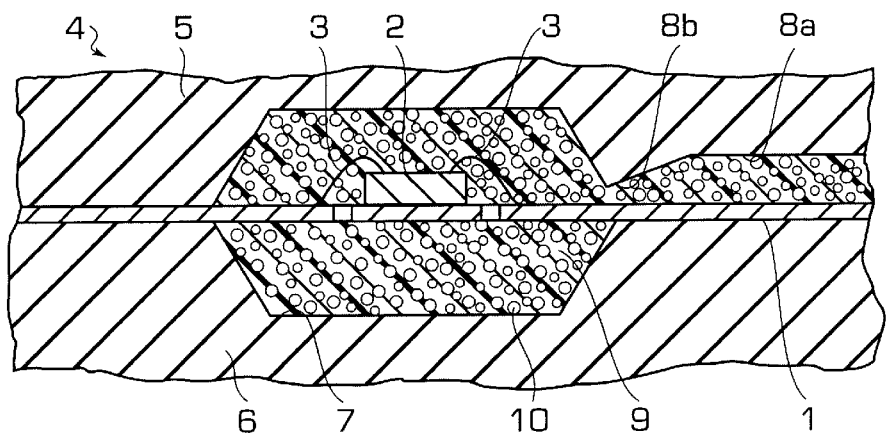

FIG. 1(a) shows a lead frame 1 including a die pad 1a and inner leads 1b. As shown in FIG. 1(b), a semiconductor chip 2 is mounted on and joined to the die pad 1a of the lead frame 1, and electrodes (not shown) on an upper surface of the semiconductor chip 2 are connected to the inner leads 1b by wires 3 according to a wire bonding process. Then, as shown in FIG. 1(c), the lead frame 1 with the semiconductor chip 2 thus mounted and connected is placed in a primary mold die set 4 having a mold cavity 7, which is thereafter filled with a sealing resin 9.

The primary mold die set 4, which is used in a conventional transfer molding machine, comprises upper and lower mold dies 5, 6 which sandwich the lead frame 1 therebetween. The mold cavity 7 is defined in confronting surfaces of the upper and lower mold dies 5, 6 in surrounding relation to the semiconductor chip 2, the wires 3, the die pad 1a, and the inner leads 1b. The upper mold die 5 has a runner 8a and a gate 8b through which the sealing resin 9 is introduced.

The sealing resin 9 which fills the mold cavity 7 and the runner 8a makes up a first sealing resin layer. In this embodiment, the sealing resin 9 comprises an epoxy resin which is widely used as a sealing resin for encasing semiconductor chips.

The sealing resin 9 is introduced into the mold cavity 7 under such a pressure at such a rate that voids (minute air bubbles) 10 will be developed in the sealing resin 9 which has filled the mold cavity 7. Specifically, the pressure under which the sealing resin 9 is introduced into the mold cavity 7 is lower than the normal pressure which is employed when a semiconductor chip is generally encased in the sealing resin by a mold die set, and the rate at which the sealing resin 9 is introduced into the mold cavity 7 is lower than or substantially the same as the normal rate which is employed when a semiconductor chip is generally encased in the sealing resin by a mold die set. The voids 10 developed in the sealing resin 9 comprise minute air bubbles.

Figure 1D:
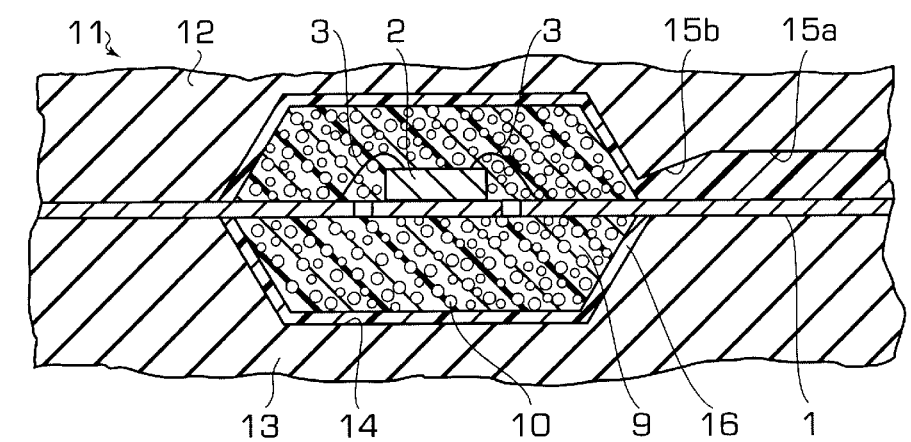

After the sealing resin 9 is solidified, the lead frame 1 and the molded sealing resin 9 around the semiconductor chip 2 are separated from the mold die is set 4, and the portion of the sealing resin 9 which has been molded in the runner 8a is removed. Thereafter, as shown in FIG. 1(d), the lead frame 1 and the molded sealing resin 9 are placed in a secondary mold die set 11 having a mold cavity 14, a runner 15a, and a gate 15b. Then, the mold cavity 14, which surrounds the molded sealing resin 9-around the semiconductor chip 2, is filled with a sealing resin 16. At this time, the pressure under which and the rate at which the sealing resin 16 is introduced into the mold cavity 14 are equal to those pressure and rate which are employed when a semiconductor chip is generally encased in a sealing resin by a mold die set.

When the introduced sealing resin 16 is solidified, the sealing resin 9 molded in the primary mold die set 4 is encased and sealed by the sealing resin 16. After the sealing resin 16 is solidified, the lead frame 1 and the molded sealing resin 16 around the sealing resin 9 are separated from the secondary mold die set 11, and the portion of the sealing resin 16 which has been molded in the runner 15a is removed.

The secondary mold die set 11, which is also used in a conventional transfer molding machine, comprises upper and lower mold dies 12, 13 which sandwich the lead frame 1 therebetween. The mold cavity 14 is defined in confronting surfaces of the upper and lower mold dies 12, 13 in surrounding relation to the molded sealing resin 9 on the lead frame 1. The upper mold die 12 has the runner 15a and the gate 15b through which the sealing resin 16 is introduced.

The sealing resin 16 which fills the mold cavity 14 and the runner 15a makes up a second sealing resin layer. In this embodiment, the sealing resin 16 also comprises an epoxy resin. The sealing resin 16 contains no voids.

Figure 1E:
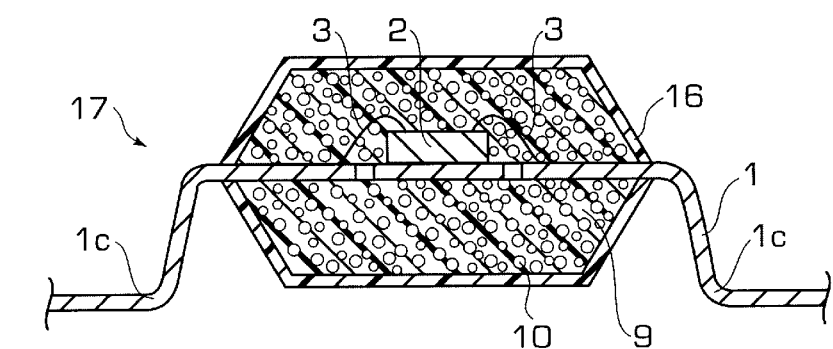
FIG. 1(e) shows a cross-sectional view of an ultrahigh-frequency electronic component according to a first embodiment of the present invention.

Thereafter, outer leads 1c of the lead frame 1 are sheared, and bent as shown in FIG. 1(e), thus producing an ultrahigh-frequency semiconductor electronic component 17.

The ultrahigh-frequency semiconductor electronic component 17 comprises a first sealing resin layer (sealing resin 9) encasing the semiconductor chip 2 therein and a second sealing resin layer (sealing resin 16) encasing the first sealing resin layer, and the first sealing resin layer contains a number of voids 10. Because of the voids 10, the first sealing resin layer has a density smaller than that of the layer which contain no voids but is fully solid in its entirety. Therefore, the permittivity of the first sealing resin layer is relatively low.

The ultrahigh-frequency semiconductor electronic component 17 exhibits excellent high-frequency characteristics even without using an expensive sealing resin to lower the permittivity or introducing a material for reducing the permittivity into the sealing resin.

Since the sealing resin 9 of the first sealing resin layer and the sealing resin 16 of the second sealing resin layer are of the same resin material, fabrication process control is easy for introducing these sealing resins 9, 16 into the primary and secondary mold die sets 4, 11.

The permittivity of the sealing resin 9 which surrounds the semiconductor chip 2 is reduced by controlling the conditions for introducing the sealing resin 9 into the primary mold die set 4 so as to produce voids 10 in the sealing resin 9. Consequently, the ultrahigh-frequency semiconductor electronic component 17 which exhibits excellent high-frequency characteristics can easily be manufactured. When the sealing resin 9 is introduced into the primary mold die set 4 under the conditions to produce voids 10 in the sealing resin 9, the voids 10 are prevented from being localized in the sealing resin 9, but are dispersed substantially uniformly in the sealing resin 9 in its entirety. Thus, no separate step of uniformly dispersing a mixed material in the sealing resin 9 is needed since hollow bodies or the like are not required to be mixed with the sealing resin 9 for reducing the permittivity.

Inasmuch as the sealing resin 16 is molded by the secondary mold die set 11 after the sealing resin 9 is molded by the primary mold die set 4, the sealing resins 9, 16 can be molded to accurate dimensions. As a consequence, the sealing resin 9 which tends to be relatively small in rigidity due to the voids 10 is prevented from becoming excessively large in size, and can be covered with the sealing resin 16 as the second sealing resin layer which has a suitable wall thickness.

The pressure under which the sealing resin 9 is introduced into the mold cavity 7 is lower than the pressure under which a sealing resin is introduced so as not to produce voids therein. The mold die set 4 is thus not required to be of a highly pressure-resistant structure which is a substantial modification of conventional mold die sets. Accordingly, the cost of manufacture of the ultrahigh-frequency electronic component is prevented from being substantially increased.

While the sealing resins 9, 16 comprise an epoxy resin in the above embodiment, they may comprise a liquid crystal polymer (LCP), polyphenylene sulfide (PPS), or the like.

An ultrahigh-frequency electronic component according to a second embodiment of the present invention will be described below with reference to FIGS. 2(a) and 2(b). Those parts of the ultrahigh-frequency electronic component according to the second embodiment which are identical to those of the ultrahigh-frequency electronic component according to the first embodiment are denoted by identical reference numerals and representations.

Figure 2A:
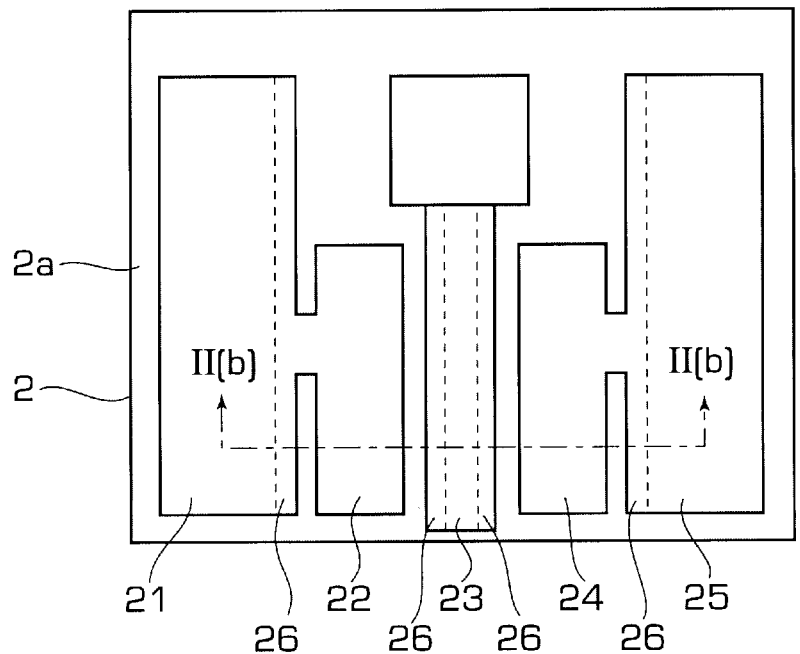
FIG. 2(a) is a schematic plan view of an ultrahigh-frequency electronic component according to a second embodiment of the present invention.
Figure 2B:
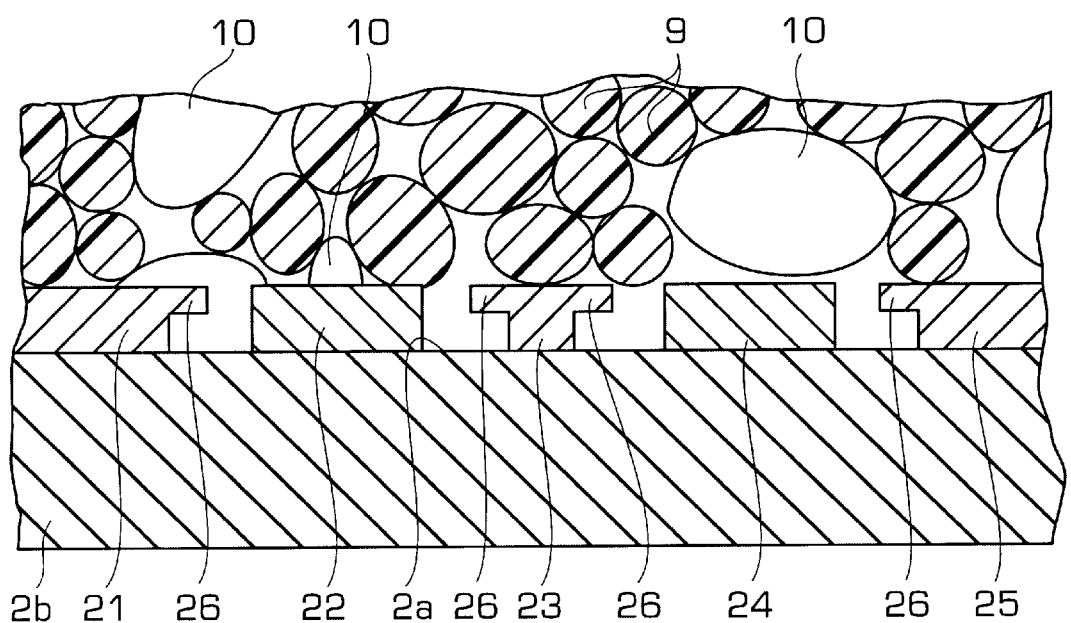
FIG. 2(b) is a cross-sectional view taken along line II(b)—II(b) of FIG. 2(a)

As shown in FIGS. 2(a) and 2(b), the ultrahigh-frequency electronic component comprises an ultrahigh-frequency semiconductor chip 2 having a plurality of conductors 21–25 as electrodes and electrode pads disposed on a surface 2a of a semiconductor substrate 2b. The conductor 22 serves as a source electrode, the conductor 21 as a source electrode pad connected to the source electrode 22, the conductor 23 as a T- or mushroom-shaped gate electrode and gate electrode pad, the conductor 24 as a drain electrode, and the conductor 25 as a drain electrode pad connected to the drain electrode 24. The conductors 22–24 are juxtaposed in laterally spaced relation as shown in FIG. 2(a). The central gate electrode 23 which is disposed between the conductors 22, 24 has a T- or mushroom-shaped overhanging flange 26. The source electrode pad 21 and the drain electrode pad 25 have respective overhanging flanges 26 each as an upper arm of an inverted L-shaped cross section.

The flanges 26 extend parallel to the surface 2a of the semiconductor substrate 2b from upper ends of the conductors 21, 23, 25 which project upwardly from the surface 2a.

The flanges 26 of the gate electrode 23 project from both sides thereof, and the flanges 26 of the source electrode pad 21 and the drain electrode pad 25 project from their sides which face the source and drain electrodes 22, 24.

The ultrahigh-frequency semiconductor chip 2 shown in FIGS. 2(a) and 2(b) is encased in the sealing resin 9 in the same manner as with the above mentioned process embodiment. Specifically, the sealing resin 9 is introduced into a primary mold die set under the conditions which develop voids 10, and thereafter the solidified sealing resin 9 is encased by the other sealing resin 16 which is introduced under the usual sealing conditions which do not develop voids.

With the flanges 26 on the conductors 21, 23, 25, the sealing resin 9 as it is introduced finds it difficult to flow in between the flanges 26 and the surface 2a of the semiconductor substrate 2b. Accordingly, voids 10 are liable to be easily formed around the flanges 26. The permittivity of the solidified sealing resin 9 in a region held in contact with the conductors 21–25 is therefore relatively low.

A specific example of a process of introducing the sealing resins 9, 16 into the mold die sets 4, 11 will be described below.

When the gate 8b (see FIG. 1(c) and 1(d)) had a vertical dimension or height of 0.25 mm and a horizontal dimension or width of 0.5 mm, and the sealing resin 9 was introduced into the primary mold die set 4 under a pressure of 50 kg/cm$^2$ at a rate of 1.7 mm/sec, then the period of time over which the sealing resin 9 was introduced into the primary mold die set 4 was about 10 seconds. The sealing resin 16 was introduced into the secondary mold die set 11 under a pressure of 100 kg/cm$^2$ at a rate of 1.7 mm/sec. The amounts of the introduced sealing resins 9, 16 were such that the sealing resins 9, 16 filled up the respective mold cavities 7, 14.

The molded sealing resin 9 contained uniformly dispersed voids having sizes ranging from several tens $\mu$m to 500 $\mu$m. The sealing resin which contained no voids had a relative permittivity of 4, whereas the sealing resin which contained voids had a relative permittivity of 3.

Figure 3:
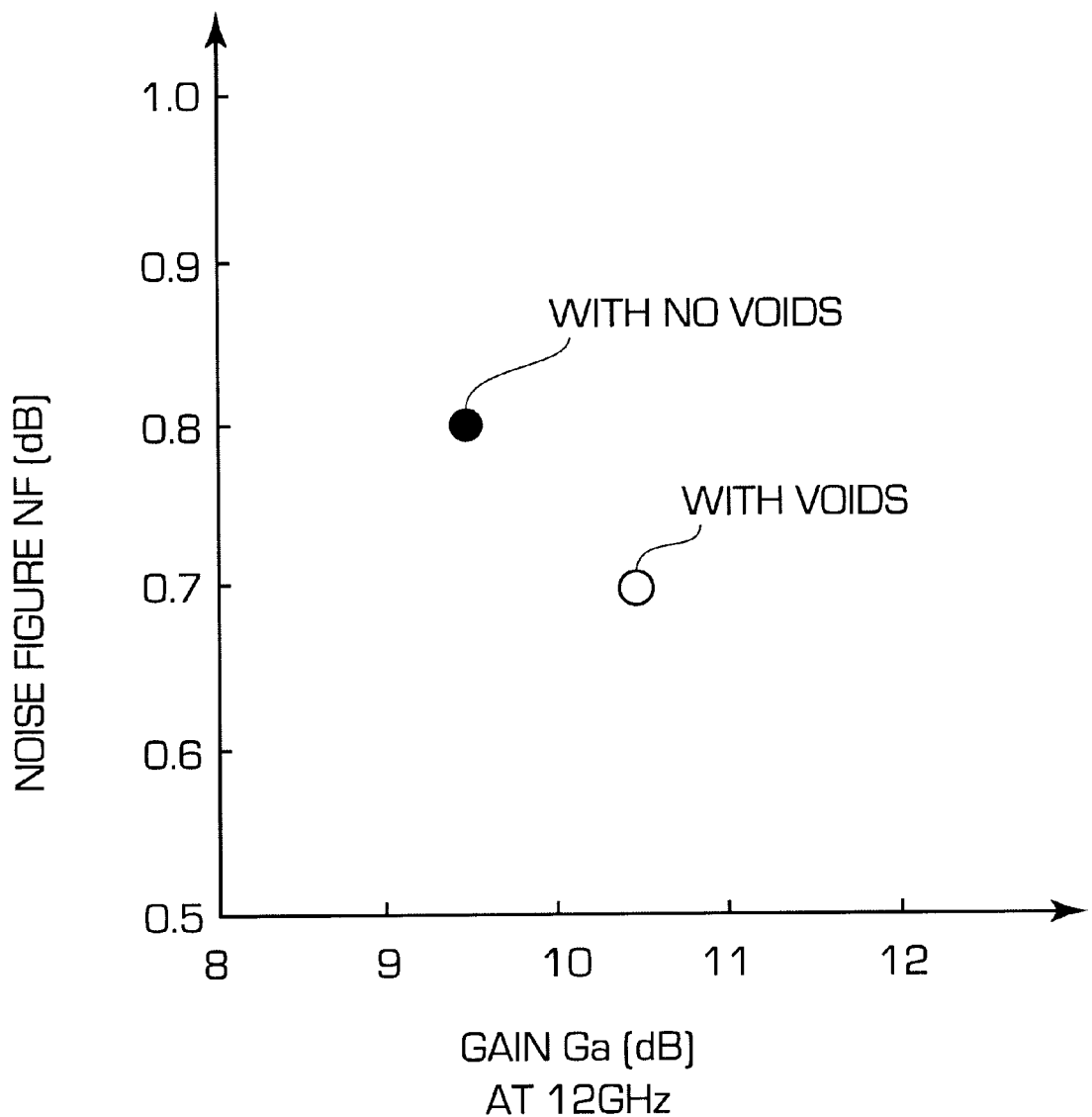
FIG. 3 is a graph showing high-frequency characteristics of the ultrahigh-frequency electronic component according to the first embodiment of the present invention and a conventional ultrahigh-frequency electronic component.

FIG. 3 shows high-frequency characteristics of the ultrahigh-frequency electronic component according to the first embodiment and a conventional ultrahigh-frequency electronic component which comprises an ultrahigh-frequency chip encased in an epoxy resin with no voids.

In FIG. 3, the black dot represents the high-frequency characteristics of the conventional ultrahigh-frequency electronic component, and the white dot represents the high-frequency characteristics of the ultrahigh-frequency electronic component according to the first embodiment. As can be seen from FIG. 3, the ultrahigh-frequency electronic component according to the first embodiment have a noise figure NF which is smaller than the noise figure NF of the conventional ultrahigh-frequency electronic component. The smaller noise figure NF of the ultrahigh-frequency electronic component according to the first embodiment is attributable to the fact that the noise figure NF is generally proportional to the capacitance between the gate and the source.

While preferred embodiments of the present invention have been described using specific terms, such description is for illustrative purposes only, and it is to be understood that changes and variations may be made without departing from the spirit or scope of the following claims.

What is claimed is:

1. A method of manufacturing an ultrahigh-frequency electronic component having an ultrahigh-frequency chip mounted on a lead frame and electrically connected thereto by wire bonding, the ultrahigh-frequency chip being encased by sealing resin, comprising:

placing the ultrahigh-frequency chip and the lead frame in a first mold cavity of a primary mold die set;

introducing a first sealing resin into said first mold cavity under a first condition to produce voids in the first sealing resin;

removing the ultrahigh-frequency chip and the lead frame encased in the solidified first sealing resin from said primary mold die set;

placing the ultrahigh-frequency chip and the lead frame encased in the solidified first sealing resin in a second mold cavity of a secondary mold die set;

introducing a second sealing resin into said second mold cavity under a second condition to produce no voids in the second sealing resin in order to encase the first sealing resin encasing said ultrahigh-frequency chip and the lead frame; and removing the resin encased chip and lead frame from the second die set as the ultrahigh-frequency electronic component.

2. A method according to claim 1, wherein said first condition comprises a pressure lower than a normal pressure under which a sealing resin is introduced.

3. A method according to claim 1, wherein said first sealing resin and said second sealing resin are the same types of resin.

* * * * *